United States Patent

Scheckenbach et al.

[11] Patent Number: 6,074,740
[45] Date of Patent: Jun. 13, 2000

[54] METALLIZING THERMOPLASTICS

[75] Inventors: Helmut Scheckenbach, Langen; Georg Frank, Tübingen, both of Germany

[73] Assignee: Hoechst Aktiengesellschaft, Germany

[21] Appl. No.: 08/787,903

[22] Filed: Jan. 23, 1997

[30] Foreign Application Priority Data

Jan. 26, 1996 [DE] Germany ............. 196 02 659

[51] Int. Cl.[7] ............. C23C 16/00; B32B 5/16
[52] U.S. Cl. ............. 428/327; 204/192.14; 264/83; 264/349; 427/250; 428/412; 428/421; 428/423.1; 428/450; 428/457; 428/458; 428/463
[58] Field of Search .................. 428/457, 327, 428/460, 458, 323, 450, 463, 423.1, 425.8, 421; 264/349, 83; 204/192.14; 427/250

[56] References Cited

U.S. PATENT DOCUMENTS

| | | |
|---|---|---|
| 4,541,894 | 9/1985 | Cassat . |
| 4,590,115 | 5/1986 | Cassat ............... 428/174 |
| 4,610,918 | 9/1986 | Effenberger et al. ........ 428/245 |
| 4,886,681 | 12/1989 | Clabes et al. ............. 427/38 |
| 4,990,363 | 2/1991 | Subr et al. ............. 427/40 |
| 5,008,142 | 4/1991 | Wilson et al. ............. 428/203 |
| 5,110,633 | 5/1992 | Cassat et al. ............. 427/404 |
| 5,112,462 | 5/1992 | Swisher ............. 205/165 |
| 5,502,207 | 3/1996 | Futaesaku et al. ............. 548/435 |
| 5,519,479 | 5/1996 | Shimizu et al. ............. 355/285 |
| 5,671,211 | 9/1997 | Akashi et al. ............. 369/275.1 |
| 5,750,221 | 5/1998 | Scheckenbach et al. ............. 428/35.7 |
| 5,783,633 | 7/1998 | Sperling et al. ............. 525/131 |
| 5,864,095 | 1/1999 | Scheckenbach et al. ......... 174/120 R |
| 5,883,192 | 3/1999 | Natori et al. ............. 525/98 |

FOREIGN PATENT DOCUMENTS

| | | |
|---|---|---|
| 2023846 | of 0000 | Canada . |
| 0 128 843 | 12/1984 | European Pat. Off. . |
| 0 206 145 | 12/1986 | European Pat. Off. . |
| 0 321 734 | 6/1989 | European Pat. Off. . |
| 0 414 097 | 2/1991 | European Pat. Off. . |
| 0 417 037 | 3/1991 | European Pat. Off. . |
| 0 418 719 | 3/1991 | European Pat. Off. . |

*Primary Examiner*—Paul Thibodeau
*Assistant Examiner*—Kevin R Kruer
*Attorney, Agent, or Firm*—Connolly Bove Lodge & Hutz

[57] ABSTRACT

Metallized moldings of polymer mixtures comprise a thermoplastic and a filler. The thermoplastic polymer has a melting point of more than 100° C. and may be selected from the group consisting of fluoropolymers, polyamides, polycarbomates, polyesters, polyimides, liquid crystalline polymers, polymethyl methacrylates, polyphenylene oxides, polysulfones, polyurethanes and silicones. The filler may comprise oxidized polyarylene sulfide polyarylene sulfide, polyimide, aromatic polyester, or polyether ketone.

11 Claims, 1 Drawing Sheet

METALLIZING THERMOPLASTICS

FIELD OF INVENTION

The invention relates to metallized moldings prepared using polymer mixtures which comprise at least one thermoplastic polymer, and which are not homogeneous and include at least two phases, and to a process for preparing them.

DESCRIPTION OF THE RELATED ART

The customary method of metallizing plastics is by electrochemical deposition of metals onto their surfaces. This involves a first step of chemical or mechanical pretreatment of the plastics surface, a second step of applying a discontinuous primer, a third step of applying a very thin continuous metallic coat by means of a chemical reinforcement bath comprising a metal salt and a reducing agent; finally, the substrate which has been pretreated in this way is passed on for electrochemical metallization in an aqueous solution of a metal salt in order to give it a thicker coat of the metal. The primer coating is applied by, for example, placing the pretreated substrate in an acidic solution of a tin salt, and then metallizing the article in an aqueous solution of a noble metal. The two baths can also be combined.

This method is fairly complicated and includes a large number of individual steps which involve awkward processing conditions. Whereas chemical and/or mechanical pretreatment often leads to damage to the substrate, the application of the metal primer is frequently accompanied by problems resulting from deficient wettability of the plastics surface by the primer solution. The resulting primer coat is of poor quality, is discontinuous and does not adhere well. This and other special metallization techniques are described, for example, in U.S. Pat. No. 4,590,115.

EP-A 0 414 097 likewise describes a wet-chemical method for electrolytic metallization of nonmetallic substrates for the purpose of producing printed circuits. The document relates to a simplification in the production sequence and to an increase in the end quality of the circuits. However, the method described still has the system-related disadvantages of the wet-chemical methods.

A further wet-chemical method is described by EP-A 0 417 037. In this case, a plastic article is coated with a thin noble-metal coat, the plastic comprising a filler which leads to improved adhesion of the noble metal particles to the surface of the plastic article to be metallized, and which minimizes the loss of these metals as a result of deposition in the bath. The fillers used here are metal oxides such as MnO, NiO, $Cu_2O$, SnO and $Bi_2O_3$. Disadvantages of these fillers, however, are their limited chemical stability and their weight.

A fundamental disadvantage of all known wet-chemical methods is that metallization is necessarily preceded by relatively complex pretreatment sequences in order to achieve the desired adhesion levels.

These disadvantages can be overcome by using a process in which the metallization of plastics, especially of fluoropolymers, takes place by decomposition of organometallic compounds in a plasma (EP-A 0 321 734). A disadvantage here, however, is the low degree of control over the ionic energy, the surrounding gas pressure, the substrate temperature, etc. Likewise, it is very difficult to obtain good control over the energy beam flux. A further disadvantage are the high pressures (about 133 Pa) required in order to ensure continuing discharge. Furthermore, these pressures are too high for vapor deposition of the metal particles to be carried out continuously.

These disadvantages can be overcome by using a process which operates with low-energy particles and is described in EP-A 0 206 145. A disadvantage of this process, however, is the inadequate adhesion of the metal coating in the case where certain organic substrates are used, for example fluoropolymers.

The object of the invention was to develop molding compositions based on high-performance polymers which can be metallized by means of sputtering or vapor deposition, and for which improved adhesion of the metal coat on the polymer substrate is achieved relative to the starting polymers.

BRIEF SUMMARY OF THE INVENTION

It has surprisingly been found that metallized plastics parts having improved properties, and in particular improved adhesion of the metal coat to the plastics substrate, can be prepared with the use of inhomogeneous, multiphase polymer mixtures which in addition to a thermoplastic polymer comprise at least one polyarylene sulfide, oxidized polyarylene sulfide, polyimide, aromatic polyester or polyether ketone.

DETAILED DESCRIPTION

Figure 1:
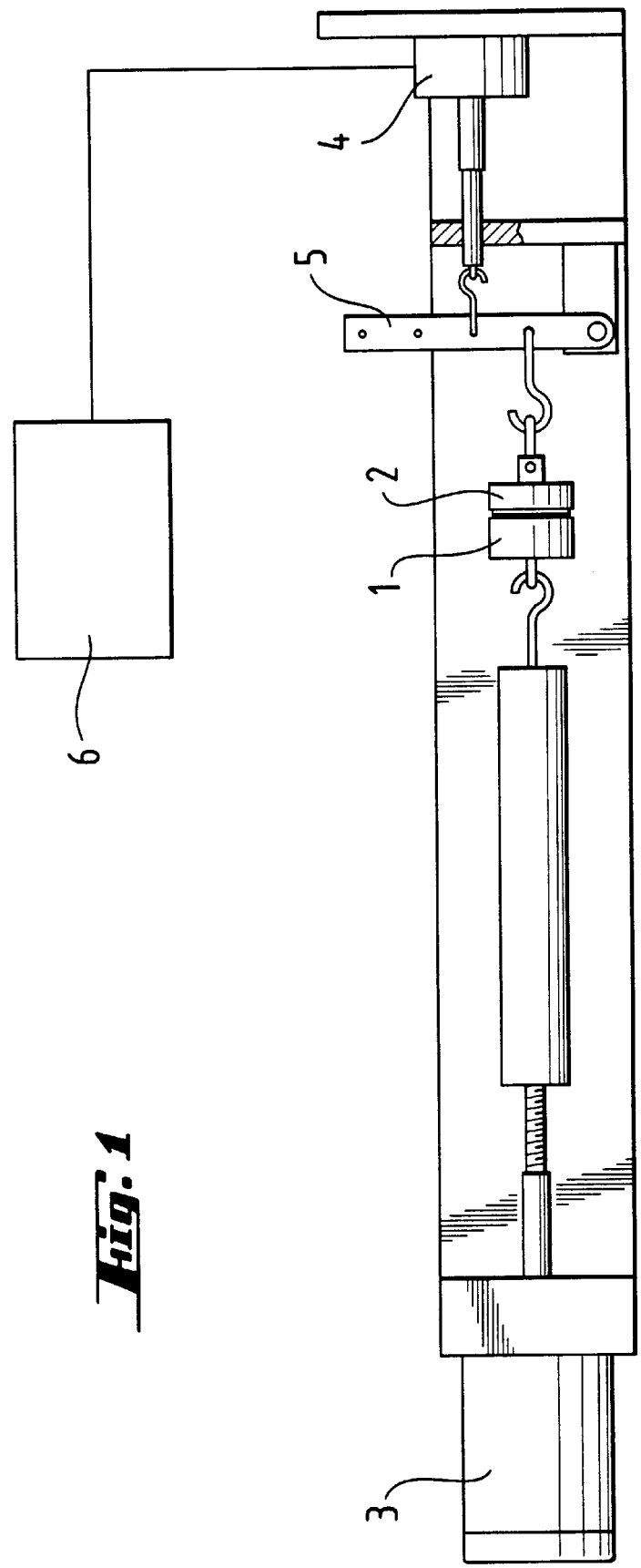
FIG. 1 is a front elevational view of an arrangement for determining the adhesion strength of a metallized coating on a thermoplastic substrate.

The invention therefore provides metallized plastics parts based on multiphase polymer mixtures which comprise A) a thermoplastic and B) a filler, the defining feature of these mixtures being that the filler is at least one polyarylene sulfide, oxidized polyarylene sulfide, polyimide, aromatic polyester, polyether ketone or mixture thereof.

The invention also provides a process for preparing plastics parts with a firmly adhering metal coating, which involves first producing moldings by shaping operations from multiphase polymer mixtures of the above composition and then metallizing the moldings by vapor deposition or sputtering.

Thermoplastic polymers which are suitable in accordance with the invention are, for example, polymers having a melting point of more than 100° C., high temperature-resistant polymers or high-performance polymers. The high-performance polymers include fluoropolymers, polyamides, polycarbonates, polyesters, polyimides, liquid-crystalline polymers (LCPs), polymethyl methacrylates, polyphenylene oxides, polysulfones, polyurethanes and silicones. Preferred thermoplastics are fluoropolymers, especially polytetrafluoroethylene (PTFE).

The plastics parts are metallized preferably by vapor deposition or sputtering. Metallization is not restricted to a specific metal. The metal coats produced may, for example, comprise copper, silver, aluminum, gold, titanium, iron, chromium or nickel.

The term high-performance polymers refers to plastics having a melting point of more than 100° C., in particular more than 200° C. They are described, for example, in Ullmann's Encyclopedia of Industrial Chemistry, 5th edition, VCH Verlagsgesellschaft mbH, Weinheim-New York 1992: organic fluoropolymers, Volume A11, pp. 393–430; polyamides, Volume A21, pp.179–206;

polycarbonates, Volume A21, pp. 207–216; polyesters, Volume A21, pp. 227–252; polyimides, Volume A21, pp. 253–273; polymer blends, Volume A21, pp. 274–305; high temperature-resistant polymers, Volume A21, pp. 449–472; polymethyl methacrylates, Volume A21, pp. 473–486; polyphenylene oxides, Volume A21, pp. 605–614; polyurethanes, Volume A21, pp. 665–716 and silicones, Volume A24, pp. 57–95, which are acknowledged by reference.

Polyarylene sulfides, also known as polyarylene thioethers, are polymers which include at least one arylene sulfide unit (—A—S—; A=arylene radical, S=sulfur). Examples of arylenes are phenylene, biphenylene (—$C_6H_4$—$C_6H_4$—) and naphthylene, which can be substituted one or more times. Examples of substituents are straight-chain, cyclic or branched $C_1$–$C_{20}$ hydrocarbon radicals, such as $C_1$–$C_{10}$-alkyl radicals, e.g. methyl, ethyl, n-propyl, isopropyl, n-butyl, t-butyl and n-hexyl, and $C_6$–$C_{14}$-aryl radicals, e.g. phenyl and naphthyl; halogens, and sulfonic acid, amino, nitro, cyano, hydroxyl and carboxyl groups. Polyphenylene sulfide (PPS) is particularly suitable as a mixture constituent B).

Polyarylene sulfides, especially polyphenylene sulfide, can be prepared on the basis of the reaction of dihalogenated aromatic compounds with sodium sulfide by the method of Edmonds and Hill. Polyarylene sulfides and their preparation are described in Ullmann's Encyclopedia of Industrial Chemistry, Volume A21, B. Elvers, S. Hawkins and G. Schulz (eds.), VCH, Weinheim-New York 1992, pp. 463–472, which is acknowledged by reference. The synthesis of polyarylene sulfides containing sulfone groups is described in Chimia 28(9), (1974) 567, which is likewise acknowledged by reference.

Oxidized polyarylene sulfides are linear and branched polyarylenes, some or all of whose sulfur groups have been converted to sulfoxide and/or sulfone groups. Oxidized polyarylene sulfides and their preparation are described in the German Patent Applications DE 43 14 737 and DE 43 14 738, which are acknowledged by reference. Examples of oxidized polyarylene sulfides are polyarylene sulfoxides, polyarylene sulfones, polyarylene sulfide sulfoxides, polyarylene sulfide sulfoxide sulfones, polyarylene sulfide sulfones and polyarylene sulfoxide sulfones. Particularly preferred polyarylene sulfones or polyarylene sulfide sulfoxide sulfones are oxidized polyarylene sulfides in which at least 40%, preferably at least 60%, of the sulfur bridges have been transformed to sulfone groups. Preferred polyarylene sulfones are polyphenylene sulfones, especially polyphenylene sulfones with at least 40%, preferably at least 60%, of sulfone groups. Oxidized polyarylene sulfides are particularly heat resistant, and highly stable under the conditions of thermoplastic processing. The oxidized polyarylene sulfides behave like fillers in the thermoplastics.

Polyimides are described, for example, in Ullmann's Encyclopedia of Industrial Chemistry, Volume A21, VCH Verlagsgesellschaft mbH, Weinheim-New York 1992, pp. 253–272, which is acknowledged by reference. The polyimides comprise the thermoplastic polyimides as well as polyimides obtainable by polycondensation or polyaddition.

A particularly suitable polyimide is one having the formula

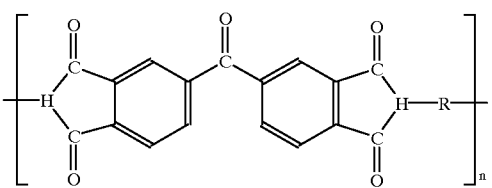

This polyimide is available under the tradename P84 from Lenzing AG, Lenzing, Austria.

Linear aromatic polyesters are described, for example, in Ullmann's Encyclopedia of Industrial Chemistry, Volume A21, VCH Verlagsgesellschaft mbH, Weinheim-New York 1992, pp. 227–251, which is acknowledged by reference.

A particularly suitable polyester is one with oxybenzoyl units —O—$C_6H_4$—CO. The polyester is available under the tradename Sumika Super E101 S from Sumitomo Chemical Co., Ltd., Tokyo, Japan, and as Ekonol from The Carborundum Company, Sanborn, N.Y., USA.

A particularly suitable polyether ketone is a polyether ether ketone which is available under the designation Victrex PEEK 150XF as a finely ground material with a mean particle size of about 30 $\mu$m from Victrex Deutschland GmbH, Hofheim, Germany.

Of the mixture constituents B), which are responsible for the improved metallizability, the oxidized polyarylene sulfides are particularly suitable, since in addition to improving the metallizability they also exhibit outstanding chemical resistance. Fluoropolymers, for example, substantially retain their universal chemical resistance as a result of the addition of oxidized polyphenylene sulfides, especially polyphenylene sulfone.

The mixture constituents B) are advantageously employed as powders. The mean particle size ($d_{50}$) of the powders is generally in the range from $0.3 \times 10^{-6}$ to $500 \times 10^{-6}$ m, preferably from $1 \times 10^{31\ 6}$ to $100 \times 10^{-6}$ m and, in particular, from $5 \times 10^{-6}$ to $50 \times 10^{-6}$ m. For particularly good adhesion of the metal coat on the substrate surface, the aim should be for as small a particle size as possible, especially of the mixture constituent B) which may not be meltable.

The proportion of the mixture constituents B) is in the range from 1 to 99 percent by weight, advantageously from 1 to 30 percent by weight, in particular from 1 to 20 percent by weight, the percentages by weight being based in each case on the overall weight of the polymer mixture. A proportion in the range from 5 to 15 percent by weight is particularly preferred in accordance with the invention.

The novel polymer mixtures may include customary additives, such as thermal stabilizers, UV stabilizers, antistats, flameproofing agents, dyes, pigments, inorganic and/or organic fillers, and also lubricant additives, such as molybdenum disulfide or graphite.

The mixtures according to the invention are generally prepared from the individual components in mixers suitable for this purpose, and then processed by known methods (e.g. injection molding, hot pressing, extrusion, blow molding, sintering) in appropriate apparatus at temperatures from 150° C. to 450° C., preferably from 200 to 400° C., to form moldings (the substrates), which are then metallized.

The novel metallized plastics articles are employed in a very wide variety of industrial sectors in which metallic surfaces are required, for example in the automotive industry, for instance for surrounds of display instruments, radios, door handles, and for window levers, heating grilles, dashboard buttons, headlamp reflectors, rear lights, etc., and also in the radio, TV and electronics industry, especially for printed circuits, and also in multilayer and hybrid circuits, and as chip supports, and in EMI shielding installations, etc.; they are used, moreover, in the aircraft industry, in dentistry and medicine, in the optics industry, for example in the production of mirrors, and in household articles.

WORKING EXAMPLES

Preparation of polyphenylene sulfone (PPSO$_2$):

63 kg of polyphenylene sulfide powder ($d_{50}$:20 μm) with a $T_g$ of 94° C. and a $T_m$ of 290° C. were placed in 219 l of glacial acetic acid at 50° C., 1.2 l of conc. sulfuric acid were added, and 91 kg of hydrogen peroxide (50%) were added dropwise over the course of 3 h, during which the temperature rose to 60–65° C. Following an after-stirring time of 2 h at 65° C. and 1 h at 80° C., the reaction solution was cooled and filtered off with suction at 50° C., and the solid product was washed with water and dried.

Yield: 70 kg; DSC data: $T_g$: 352° C.; $T_m$: 520° C. (decomposition)

Elemental analysis: $(C_6H_4SO_2)_n$

C: 55.6%, H: 3.2%, S: 24.6%, O: 16.0%.

This corresponds to a degree of sulfur oxidation in the polymer of about 65%, based on 100% of the theoretically possible uptake of oxygen.

In the Examples, the following polymers were also used:

®Sumika Super E 101 S, a linear aromatic polyester (product form: powder) from Sumitomo Chemical Co. Ltd., Tokyo, Japan. Product properties and hints on processing are documented in the data sheet "Sumika Super" from Sumitomo Chemical Co. Ltd.

P 84, a polyimide (product form: powder) from Lenzing AG, Lenzing, Austria. Product properties and hints on processing are documented in the data sheet "Lenzing P 84" from Lenzing AG.

®Fortron 0205 B4/20, a polyphenylene sulfide (product form: powder) from Hoechst AG, Frankfurt a.M., FR Germany. Product properties and hints on processing are documented in the data sheet "Fortron" from Hoechst AG.

Ground unsized textile glass fibers consisting of individual filaments of varying length (mean fiber length: 60 μm, fiber diameter: 14 μm)

®Hostaflon TF 1750, a polytetrafluoroethylene (product form: powder) from Hoechst AG, Frankfurt a.M., FR Germany. Product properties and hints on processing are documented in the data sheet "Hostaflon" from Hoechst AG.

Hostaflon PFA 6515, a fluorinated thermoplastic (product form: powder) from Hoechst AG, Frankfurt a.M., FR Germany. Product properties and hints on processing are documented in the data sheet "Hostaflon" from Hoechst AG.

Polybutylene terephthalate (PBT) with an MVI (250° C./2.16 kg) of 38 cm$^3$/10 min. Product form: granules.

®Vectra A950, a liquid-crystalline polymer (product form: granules) from Hoechst AG, Frankfurt a.M., FR Germany. Product properties and hints on processing are documented in the data sheet "Vectra" from Hoechst AG.

®Ultem 1000, a polyetherimide (product form: granules) from General Electric Plastics GmbH, Rüsselsheim, FR Germany. Product properties and hints on processing are documented in the data sheet "Ultem" from General Electric Plastics.

®Udel P-1700, a polysulfone (product form: granules) from Amoco Chemical Deutschland GmbH, Düsseldorf, FR Germany. Product properties and hints on processing are documented in the data sheet "Amoco Performance Products" from Amoco.

PEEK 450 G, a polyether ether ketone (product form: granules) from Victrex Deutschland GmbH, Hofheim, FR Germany. Product properties and hints on processing are documented in the brochure "Victrex PEEK" from ICI Materials, Middlesbrough, England.

®Torlon 4203 L, a polyamideimide (product form: granules) from Amoco Chemical Deutschland GmbH, Düsseldorf, FR Germany. Product properties and hints on processing are documented in the data sheet "Amoco Performance Products" from Amoco.

®Ultrason S, a polysulfone (product form: granules) from BASF AG, Ludwigshafen, FR Germany. Product properties and hints on processing are documented in the brochure "Ultrason S, Ultrason E" from BASF.

Ultrason E, a polyether sulfone (product form: granules) from BASF AG, Ludwigshafen, FR Germany. Product properties and hints on processing are documented in the brochure "Ultrason S, Ultrason E" from BASF.

PEEK 150XF, a finely ground polyether ether ketone with a mean particle size of about 30 μm, which is obtainable from Victrex Deutschland GmbH, Hofheim, Germany.

Preparation of the compound formulations:

The granules were ground on a laboratory mill model ZM 1 from Retsch, Haan, BR Germany. The mixtures were subsequently formulated in accordance with the recipes of Tables 1 and 2. These mixtures were dried and processed on a press model Polystat 200 S from Schwabenthan, Berlin, FR Germany to form sample specimens (in the form of circular disks with a diameter of 60 mm and a thickness of 4 mm. The pressing temperatures are given before each of the tables, and the pressing time was 15 minutes in all cases).

Metallization of the specimens:

Following the production, the specimens were metallized in a commercial sputtering unit from Leybold Heraeus, Z 700. For the metallization, the specimens in the installation were placed simultaneously on a mount at a distance of 5 cm from the sputter target so as to ensure identical experimental parameters for all of the specimens. Metallization was carried out using copper of electrochemical purity. The chamber was then evacuated to about $10^{-5}$ mbar, and the samples were subsequently subjected to vacuum etching for 15 minutes with oxygen at a pressure of $5 \times 10^{-3}$ mbar. Here, a voltage of 45 V was applied to the samples, and the plasma output was 1 kW. Following vacuum etching the samples were coated immediately with Cu using Ar as sputtering gas. The output was 1 kW DC (direct current). To ensure uniform coating, the samples were rotated on their mount in the chamber at a speed of ⅓ rpm. The thickness of the Cu coat applied by sputtering was 240 nm. After the end of metallization, the samples were removed from the vacuum, and the adhesion strength was determined.

The adhesion strength was determined in an in-house apparatus whose construction is shown in FIG. 1. In detail, FIG. 1 shows a die 1 of known surface area which is bonded to the metallized area of the sample 2. The adhesive strength of the adhesive is known and is always greater than the values determined in the apparatus for the adhesion of the metal coats in Table 1 and 2. With the aid of the stepper motor 3, the die 1 is subjected to a force which is transmitted via the lever 5 to the force transducer unit 4 (Burster, model 8523 from Burster PräzisionsmeBfltechnik, Gernsbach, FR Germany), where it is measured. The force transducer unit 4 outputs a voltage signal which is plotted digitally with the aid of an electronic display unit 6 (Keithley 197 multimeter). As soon as the die 1 tears the metallization coat from the sample 2, the voltage falls back to zero, so that the tear force can be calculated from the maximum voltage. The apparatus was calibrated with samples whose tear forces were known from independent experiments. For the data given below, the absolute value of the tear force is not as important as the respective relative comparison between the values for the pure thermoplastic polymers A) and for the respective compound formulation comprising mixture component B).

COMPARISON EXAMPLE V1, EXAMPLES 1 to 9

Table 1 below sets out the individual polymer compositions and gives the tear forces measured for them. $PPSO_2$ denotes the polymer used, which has a degree of oxidation of 65% and whose preparation has been described above. For the preparation of the test specimens, the pressing temperature was 375° C. in all cases.

TABLE 1

| Example | Polymer mixture | Sputtering medium | Tear force [N/cm²] | Area of tear [%] | Adhesion [N/cm²] |
|---|---|---|---|---|---|
| C1 | Hostaflon TF 1750 | 240 nm Cu | 89 | 96 | 92 |
| 1 | 90% Hostaflon TF 1750 10% glass fiber | 240 nm Cu | 231 | 97 | 237 |
| 2 | 90% Hostaflon TF 1750 10% PPSO₂ | 240 nm Cu | 564 | 94 | 603 |
| 3 | 90% Hostaflon TF 1750 10% PPSO₂ | 100 nm Ti 240 nm Cu | 480 | 77 | 637 |
| 4 | 90% Hostaflon TF 1750 10% PPSO₂ | 10 nm TiO 100 nm Ti 240 nm Cu | 411 | 97 | 426 |
| 5 | 90% Hostaflon TF 1750 10% P 84 | 200 nm Cu | 595 | 96 | 616 |
| 6 | 90% Hostaflon TF 1750 10% Sumika Super E 101 S | 200 nm Cu | 519 | 99 | 521 |
| 7 | 90% Hostaflon TF 1750 10% Fortron 0205 B4/20 | 240 nm Cu | 488 | 96 | 508 |
| 8 | 90% Hostaflon TF 1750 5% PPSO₂ 5% P 84 | 240 nm Cu | 581 | 97 | 599 |
| 9 | 90% Hostaflon TF 1750 5% PPSO₂ 5% Sumika Super E 101S | 240 nm Cu | 543 | 98 | 554 |

COMPARISON EXAMPLE C2, EXAMPLE 10

Table 2 lists further polymer compositions and the tear forces measured on them. The pressing temperature for the preparation of the test specimens was 375° C.

TABLE 2

| Example | Polymer mixture | Sputtering medium | Tear force [N/cm²] | Area of tear [%] | Adhesion [N/cm²] |
|---|---|---|---|---|---|
| C2 | Hostaflon PFA 6516 | 240 nm Cu | 90 | 95 | 95 |
| 10 | 90% Hostaflon PFA 6516 10% PPSO₂ | 240 nm Cu | 622 | 97 | 642 |

COMPARISON EXAMPLE C3, EXAMPLES 11 and 12

Table 3 lists further polymer compositions and tear forces measured on them. The pressing temperature for the preparation of the test specimens was 250° C.

TABLE 3

| Example | Polymer mixture | Sputtering medium | Tear force [N/cm²] | Area of tear [%] | Adhesion [N/cm²] |
|---|---|---|---|---|---|
| C3 | PBT | 240 nm Cu | 3139 | 92 | 3414 |
| 11 | 95% PBT 5% PPSO₂ | 240 nm Cu | 3438 | 94 | 3656 |
| 12 | 90% PBT 10% PPSO₂ | 240 nm Cu | 3620 | 95 | 3834 |

COMPARISON EXAMPLE C4, EXAMPLE 13

Table 4 lists further polymer compositions and tear forces measured on them. The pressing temperature for the preparation of the test specimens was 300° C.

TABLE 4

| Example | Polymer mixture | Sputtering medium | Tear force [N/cm²] | Area of tear [%] | Adhesion [N/cm²] |
|---|---|---|---|---|---|
| C4 | Vectra A950 | 240 nm Cu | 532 | 92 | 570 |
| 13 | 90% Vectra A950 10% PPSO₂ | 240 nm Cu | 852 | 97 | 878 |

COMPARISON EXAMPLE C5, EXAMPLE 14 and 15

Table 5 lists further polymer compositions and tear forces measured on them. The pressing temperature for the preparation of the test specimens was 380° C.

TABLE 5

| Example | Polymer mixture | Sputtering medium | Tear force [N/cm²] | Area of tear [%] | Adhesion [N/cm²] |
|---|---|---|---|---|---|
| C5 | Ultem 1000 | 240 nm Cu | 1976 | 97 | 2025 |
| 14 | 90% Ultem 1000 10% PPSO₂ | 240 nm Cu | 2180 | 100 | 2180 |
| 15 | 90% Ultem 1000 10% P84 | 240 nm Cu | 2903 | 98 | 2965 |

COMPARISON EXAMPLE C6, EXAMPLE 16

Table 6 lists further polymer compositions and tear forces measured on them. The pressing temperature for the preparation of the test specimens was 360° C.

TABLE 6

| Example | Polymer mixture | Sputtering medium | Tear force [N/cm$^2$] | Area of tear [%] | Adhesion [N/cm$^2$] |
|---|---|---|---|---|---|
| C6 | Udel P-1700 | 240 nm Cu | 1825 | 95 | 1913 |
| 16 | 90% Udel P-1700 10% PPSO$_2$ | 240 nm Cu | 2485 | 87 | 2979 |

COMPARISON EXAMPLE C7, EXAMPLES 17 and 18

Table 7 lists further polymer compositions and tear forces measured on them. The pressing temperature for the preparation of the test specimens was 380° C.

TABLE 7

| Example | Polymer mixture | Sputtering medium | Tear force [N/cm$^2$] | Area of tear [%] | Adhesion [N/cm$^2$] |
|---|---|---|---|---|---|
| C7 | Victrex PEEK 450G | 240 nm Cu | 2340 | 87 | 2613 |
| 17 | 90% Victrex PEEK 450G 10% PPSO$_2$ | 240 nm Cu | 4194 | 100 | 4194 |
| 18 | 90% Victrex PEEK 450 G 10% P84 | 240 nm Cu | 2917 | 97 | 3010 |

COMPARISON EXAMPLE C8, EXAMPLES 19 and 20

Table 8 lists further polymer compositions and tear forces measured on them. The pressing temperature for the preparation of the test specimens was 260° C.

TABLE 8

| Example | Polymer mixture | Sputtering medium | Tear force [N/cm$^2$] | Area of tear [%] | Adhesion [N/cm$^2$] |
|---|---|---|---|---|---|
| C8 | Torlon 4203L | 240 nm Cu | 1419 | 80 | 1725 |
| 19 | 90% Torlon 4203L 10% PPSO$_2$ | 240 nm Cu | 2782 | 99 | 2799 |
| 20 | 90% Torlon 4203L 10% P84 | 240 nm Cu | 2221 | 99 | 2261 |

COMPARISON EXAMPLES C9 and C10, EXAMPLES 21 and 22

Table 9 lists further polymer compositions and tear forces measured on them. The pressing temperature for the preparation of the test specimens was 360° C.

TABLE 9

| Example | Polymer mixture | Sputtering medium | Tear force [N/cm$^2$] | Area of tear [%] | Adhesion [N/cm$^2$] |
|---|---|---|---|---|---|
| C9 | Ultrason S | 240 nm Cu | 1402 | 83 | 1661 |
| 21 | 90% Ultrason S 10% PPSO$_2$ | 240 nm Cu | 3231 | 90 | 3640 |
| C10 | Ultrason E | 240 nm Cu | 1620 | 96 | 1683 |
| 22 | 90% Ultrason E 10% PPSO$_2$ | 140 nm Cu | 2912 | 91 | 3231 |

COMPARISON EXAMPLE C 11, EXAMPLES 22, 23 and 25

Table 10 lists further polymer compositions and tear forces measured on them. The pressing temperature for the preparation of the test specimens was 375° C.

TABLE 10

| Example | Polymer mixture | Sputtering medium | Tear force [N/cm$^2$] | Area of tear [%] | Adhesion [N/cm$^2$] |
|---|---|---|---|---|---|
| C11 | Hostaflon TF 1750 | 240 nm Cu | 89 | 96 | 92 |
| 23 | 90% Hostaflon TF 1750 5% Victrex PEEK 150XF 5% PPSO$_2$ | 240 nm Cu | 406 | 100 | 406 |
| 24 | 90% Hostaflon TF 1750 10% Victrex PEEK 150XF | 240 nm Cu | 693 | 100 | 693 |
| 25 | 80% Hostaflon TF 1750 20% Victrex PEEK 150XF | 240 nm Cu | 977 | 100 | 977 |

EXAMPLES 26 to 29

In Examples 26 to 29 it is demonstrated that the effect of pretreating the samples, as was carried out in Comparison Examples C1 to C10 and in Examples 1 to 25 using oxygen, is only very small as regards the quality of adhesion of the copper to the test specimens. Table 11 compares the different adhesions of copper to PTFE/PPSO$_2$ after different pretreatments prior to metallization. The experimental details are identical with those of Example 1. The pressing temperature for the preparation of the test specimens was 375° C.

TABLE 11

| Example | Polymer mixture | Pretreatment gas | Sputtering medium | Tear force [N/cm$^2$] | Area of tear [%] | Adhesion [N/cm$^2$] |
|---|---|---|---|---|---|---|
| 26 | 90% Hostaflon TF 1750 10% PPSO$_2$ | Air | 240 nm Cu | 525 | 93 | 565 |
| 27 | 90% Hostaflon TF 1750 10% PPSO$_2$ | O$_2$ | 240 nm Cu | 564 | 94 | 603 |
| 28 | 90% Hostaflon | NH$_3$ | 240 nm Cu | 501 | 96 | 522 |

TABLE 11-continued

| Example | Polymer mixture | Pretreatment gas | Sputtering medium | Tear force [N/cm$^2$] | Area of tear [%] | Adhesion [N/cm$^2$] |
|---|---|---|---|---|---|---|
| 29 | TF 1750 10% PPSO$_2$ 90% Hostaflon TF 1750 10% PPSO$_2$ | CF$_4$ | 240 nm Cu | 551 | 94 | 584 |

What is claimed is:

1. A metallized plastics part based on a multiphase polymer mixture comprising a thermoplastic polymer A having a melting point of more than 100° C. and a polymeric filler B that promotes adhesion of a metal coat to the polymer mixture, and wherein the polymeric filler is at least one selected from the group consisting of polyarylene sulfide, oxidized polyarylene sulfide, polyimide, aromatic polyester and polyether ketone and a metal coat adhered to the polymer mixture.

2. A metallized plastics part as claimed in claim 1, wherein the thermoplastic polymers A are selected from the group consisting of fluoropolymers, polyamides, polycarbonates, polyesters, polyimides, liquid-crystalline polymers (LCPs), polymethyl methacrylates, polyphenylene oxides, polysulfones, polyurethanes and silicones.

3. A metallized plastics part as claimed in claim 1, wherein the thermoplastic polymers A comprise polytetrafluoroethylene (PTFE).

4. A metallized plastics part as claimed in claim 1, wherein the polymeric filler B comprises oxidized polyarylene sulfide.

5. A metallized plastics part as claimed in claim 1, wherein the metal coat comprises copper, silver, aluminum, gold, titanium, iron, chromium or nickel, or mixtures or alloys thereof.

6. A process for preparing a plastics part as claimed in claim 1, which comprises preparing mixtures of the thermoplastic polymer A and the polymeric filler B individual components, subsequently processing the mixtures by injection molding or hot pressing or extrusion or blow molding or sintering to form moldings at temperatures from 150 to 450° C. and then metallizing the moldings by vapor deposition or sputtering.

7. The process as claimed in claim 6, wherein mixtures of the thermoplastic polymer A and the polymeric filler B polymeric filler B are prepared in which the proportion of the B is in the range from 1 to 99 percent by weight, based on the overall weight of the multiphase polymer mixture.

8. The process as claimed in claim 7, wherein the proportion of polymeric filler B is in the range from 5 to 15 percent by weight.

9. A metallized plastics part as claimed in claim 1, wherein a tear strength between the metal coat and the polymer mixture is improved at least 10% when the amount of polymeric filler B is at least 10%.

10. A metallized plastics part as claimed in claim 1, wherein a tear strength between the metal coat and the polymer mixture is improved at least 4.5 times when the amount of polymeric filler B is at least 10% and the thermoplastic polymer A comprises a fluoropolymer.

11. A metallized plastics part as claimed in claim 1 wherein the polymeric filler B has a mean particle size in the range of from 0.3 to 500 μm.

* * * * *

UNITED STATES PATENT AND TRADEMARK OFFICE
CERTIFICATE OF CORRECTION

PATENT NO. : 6,074,740
DATED : June 13, 2000
INVENTOR(S) : Helmut Scheckenbach, Georg Frank It is certified that error appears in the above-identified patent and that said Letters Patent is hereby corrected as shown below:

In the title at code [54], the title should read -- METALLIZED THERMOSPLASTIC PLASTIC WITH IMPROVED ADHESION OF THE METAL COAT --.

Column 4,
Line 39, "$1 \times 10^{31\ 6}$" should read -- $1 \times 10^{-6}$ --.

Column 10,
Line 10, under the heading "Example" an entry "22" was omitted. Please insert -- 22 -- under the heading "Example" below the "C10" and before the "90% Ultrason".

Column 12,
Line 15, the words "polymeric filler B" should be deleted.
Line 15, the phrase -- polymeric filler -- should be added between the words "the" and "B".

Signed and Sealed this

Fourteenth Day of August, 2001

*Attest:*

*Attesting Officer*

NICHOLAS P. GODICI
*Acting Director of the United States Patent and Trademark Office*